United States Patent
Frese

(10) Patent No.: US 8,892,799 B2
(45) Date of Patent: Nov. 18, 2014

(54) ELECTRICAL CIRCUIT FOR TRANSMITTING SIGNALS BETWEEN TWO MASTERS AND ONE OR MORE SLAVES

(75) Inventor: Volker Frese, Beilstein (DE)

(73) Assignee: Robert Bosch GmbH, Stuttgart (DE)

( * ) Notice: Subject to any disclaimer, the term of this patent is extended or adjusted under 35 U.S.C. 154(b) by 259 days.

(21) Appl. No.: 13/383,068

(22) PCT Filed: Jul. 1, 2010

(86) PCT No.: PCT/EP2010/059342
§ 371 (c)(1),
(2), (4) Date: Mar. 27, 2012

(87) PCT Pub. No.: WO2011/003801
PCT Pub. Date: Jan. 13, 2011

(65) Prior Publication Data
US 2012/0179848 A1    Jul. 12, 2012

(30) Foreign Application Priority Data

Jul. 10, 2009  (DE) .......................... 10 2009 027 625

(51) Int. Cl.
| | | |
|---|---|---|
| G06F 13/00 | (2006.01) | |
| H03K 19/003 | (2006.01) | |
| G06F 13/364 | (2006.01) | |
| G06F 13/40 | (2006.01) | |
| H03K 19/0175 | (2006.01) | |

(52) U.S. Cl.
CPC ............ *H03K 19/003* (2013.01); *G06F 13/364* (2013.01); *G06F 13/4072* (2013.01); *H03K 19/017509* (2013.01); *H03K 19/01759* (2013.01)

USPC .......................................................... 710/110

(58) Field of Classification Search
USPC ........................ 710/104–119, 8–19, 305–315
See application file for complete search history.

(56) References Cited

U.S. PATENT DOCUMENTS

| | | | | | |
|---|---|---|---|---|---|
| 5,127,089 | A | * | 6/1992 | Gay et al. ..................... | 710/108 |
| 5,418,933 | A | * | 5/1995 | Kimura et al. ................ | 713/600 |
| 6,070,205 | A | * | 5/2000 | Kato et al. .................... | 710/100 |
| 6,425,031 | B1 | * | 7/2002 | Brinkhus ...................... | 710/110 |
| 6,563,356 | B2 | * | 5/2003 | Fulkerson .................... | 327/203 |
| 6,931,470 | B2 | * | 8/2005 | Ballantyne et al. ........... | 710/107 |

(Continued)

FOREIGN PATENT DOCUMENTS

| | | |
|---|---|---|
| JP | 10-307790 | 11/1998 |
| JP | 2002-271177 | 9/2002 |

*Primary Examiner* — Raymond Phan
(74) *Attorney, Agent, or Firm* — Kenyon & Kenyon LLP

(57) ABSTRACT

An electrical circuit for transmitting signals between two masters and one or more slaves is described. The two masters and the slave or slaves are connected to one another via a bus system. At least one master data signal can be generated by each of the two masters, which signal can be received by the slave or slaves. A three-state gate is present at each of the outputs of the two masters at which the respective master data signal is present. The three-state gates are effective either as closed or as open switches. The three-state gates are activated in such a way that the three-state gate associated with the one of the two masters acts as a closed switch, and the three-state gate associated with the other of the two masters acts as an open switch.

8 Claims, 3 Drawing Sheets

(56) References Cited

U.S. PATENT DOCUMENTS

| | | |
|---|---|---|
| 6,952,747 B2 * | 10/2005 | Fujiwara et al. .............. 710/110 |
| 7,162,556 B2 * | 1/2007 | Fujiki ........................... 710/110 |
| 7,228,372 B2 * | 6/2007 | Yoshimura et al. ........... 710/110 |
| 7,386,634 B2 * | 6/2008 | Murayama et al. ............... 710/3 |
| 7,689,746 B2 * | 3/2010 | Herz ............................. 710/110 |
| 7,797,476 B2 * | 9/2010 | Gupte et al. ................... 710/317 |
| 8,156,273 B2 * | 4/2012 | Moran et al. .................. 710/110 |
| 2004/0267992 A1 | 12/2004 | Stuber et al. |

* cited by examiner

ELECTRICAL CIRCUIT FOR TRANSMITTING SIGNALS BETWEEN TWO MASTERS AND ONE OR MORE SLAVES

FIELD OF THE INVENTION

The present invention relates to an electrical circuit for transmitting signals between two masters and one or more slaves.

BACKGROUND INFORMATION

In electronic circuits, in particular in digital circuits, it is known to manage access to shared components of the circuit with the aid of the so-called master/slave principle. It is thus possible for a master, for example a microprocessor, to be connected via a bus system to one or to two slaves, for example to two electronic output stages. The master sends a clock signal, a master data signal, and a select signal. With the select signal, one of the two slaves is selected as receiver. That slave receives the data signal according to the time cycle of the clock signal. The slave can furthermore send back a slave data signal to the master according to the time cycle of the received clock signal.

Since only the master can deliver the select signal and the clock signal, it is at a higher level than the two slaves. A slave can transmit a data signal to the master only if the master has previously selected it with the select signal. Access to the shared component, i.e. for example to the bus system that connects the master and the slaves, is thus managed by the master.

In electronic control devices, for example in the motor vehicle sector, it is often necessary for safety reasons to embody a microprocessor in doubled fashion, i.e. to provide a so-called backup processor. In this case both microprocessors must be operable as master, and both masters must be connectable via the bus system to the slaves. The first requirement means that the microprocessors must possess a so-called "multi-master" capability, which is usually associated with increased complexity. The second requirement entails the problem that both microprocessors, for example, deliver a clock signal, so that, for example, the clock signal generated by the first microprocessor is also applied, inter alia, to the signal output at which the second microprocessor is delivering its clock signal. This can result in damage to or destruction of electronic components of that signal output.

SUMMARY OF THE INVENTION

An object of the exemplary embodiments and/or exemplary methods of the present invention is to create an electrical circuit with which signals can be transmitted between two masters and one or more slaves.

The exemplary embodiments and/or exemplary methods of the present invention may achieve this object by way of an electrical circuit as described herein.

According to the exemplary embodiments and/or exemplary methods of the present invention, the two masters and the slave or slaves are connected to one another via a bus system. At least one master data signal can be generated by each of the two masters, which signal can be received by the slave or slaves. A three-state gate is present at each of the outputs of the two masters at which the respective master data signal is present. The three-state gates are effective either as closed or as open switches. The three-state gates are activated in such a way that the three-state gate associated with the one of the two masters acts as a closed switch, and the three-state gate associated with the other of the two masters acts as an open switch.

According to the exemplary embodiments and/or exemplary methods of the present invention, the connection present between the two masters that exists via the bus system is thus interrupted by one of the two three-state gates. The master data signal generated by one of the two masters thus has no further influence on the other master. Damage to or even destruction of components in one of the masters is thus not possible. It is, however, not necessary in this context for one of the two masters to possess the aforementioned multi-master capability. The object stated for the invention is therefore achieved with little complexity, in particular by the addition of the three-state gates.

Advantageously, those outputs of the two masters at which a clock signal and/or one or more select signals are present can also be equipped with three-state gates.

It is particularly advantageous if the three-state gates are activated as a function of a request signal that can be generated by one of the two masters when that master wishes to transmit signals on the bus system. The result achievable with this request signal is that the requesting master obtains access to the bus system and can transmit signals via the bus system.

It is further advantageous if the tri-state gates are activated as a function of whether or not a transmission on the bus system is taking place. This can be ascertained with the aid of one or more select signals. This ensures that a granting of access to the bus system is possible only when a previous transmission on the bus system has ended.

Further features, potential applications, and advantages of the invention are evident from the description below of exemplifying embodiments of the invention that are depicted in the Figures of the drawings. All features described or depicted, of themselves or in any combination, constitute the subject matter of the invention, irrespective of their grouping in the claims or their internal references, and irrespective of their presentation and depiction in the description and the drawings, respectively.

DETAILED DESCRIPTION

A large number of electronic control devices are used in the motor vehicle sector. The control devices serve, for example, to implement an antilock system for the braking system of the motor vehicle. The control device contains a microprocessor that performs the functions of the antilock system via software. The control device is connected via a bus system to electrical output stages that are provided in order to control electrically actuable valves. With the valves, the brake pressure acting on a wheel brake, and thus the braking force of the wheel, can be modified.

In the interest of the safety of the motor vehicle, it is necessary for the microprocessor in which the above-described exemplifying control device is present to be embodied in doubled fashion, so that in the event of failure of the first microprocessor, its functions can be taken over by the second microprocessor.

Figure 1:
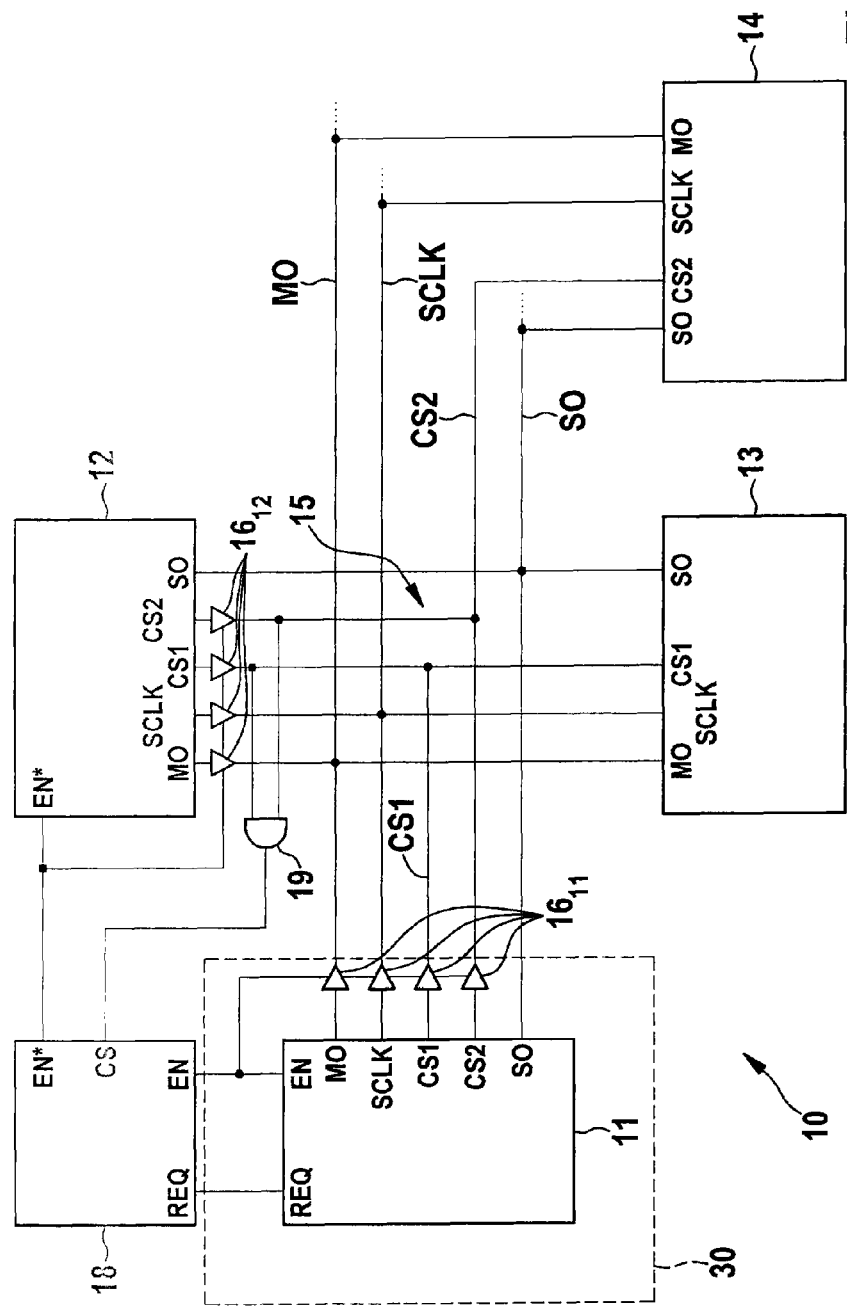
FIG. 1 is a schematic block diagram of an exemplifying embodiment of an electrical circuit according to the present invention for transmitting signals between two masters and two slaves.

FIG. 1 depicts an electrical circuit 10 that can be used in the present exemplifying case. Circuit 10 has two so-called masters 11, 12 and two so-called slaves 13, 14. The two masters 11, 12 can be the two aforesaid microprocessors, and the two slaves 13, 14 can be two output stages. It is understood that in the circuit of the Fig. it is also possible for more than two slaves 13, 14 to be present or for only a single slave to be present. It is likewise understood that masters 11, 12 and slaves 13, 14 can also be other electronic components of an electrical circuit.

Present between masters 11, 12 and slaves 13, 14 is a bus system 15 that, in the present exemplifying embodiment, is suitable for serial and synchronous transmission of electrical signals.

Both masters 11, 12 are suitable for generating a clock signal SCLK (=serial clock), and delivering it via an SCLK line. The two SCLK lines coming from masters 11, 12 are connected to one another, and attached to both slaves 13, 14. The two slaves 13, 14 are suitable for receiving and processing clock signal SCLK.

Both masters 11, 12 are suitable for generating a master data signal MO (=master out) and delivering it via an MO line. The two MO lines coming from masters 11, 12 are connected to one another and attached to both slaves 13, 14. The two slaves 13, 14 are suitable for receiving and processing signal MO.

Both masters 11, 12 are suitable for generating a select signal CS1 (=chip select), and delivering it via a CS1 line. The two CS1 lines coming from masters 11, 12 are connected to one another, and attached to one of the two slaves 13, 14. The slave 13 is suitable for receiving and processing chip select signal CS1.

Both masters 11, 12 are suitable for generating a select signal CS2 (=chip select), and delivering it via a CS2 line. The two CS2 lines coming from masters 11, 12 are connected to one another, and attached to the other of the two slaves 13, 14. The slave 14 is suitable for receiving and processing chip select signal CS2.

At the outputs of the two masters 11, 12 at which clock signal SCLK, master data signal MO, and select signals CS1, CS2 are present, so-called three-state gates 16 are interposed into the respective SCLK, MO, CS1, and CS2 lines. Three-state gates $16_{11}$ are associated with master 11, and three-state gates $16_{12}$ with master 12. These three-state gates are digital components that have one input and one output, and their output can exhibit two states as a function of a so-called Enable signal. For example, if the Enable signal is "high" or "1", the output then corresponds to the input of three-state gate 16. In this case tri-state gate 16 acts like a closed switch. If the Enable signal is, however, "low" or "0", then the output of three-state gate 16 may be switched to high impedance. In this case three-state gate 16 acts like an open switch.

The result that can be achieved with three-state gate 16 is that the signals generated and sent by the two masters 11, 12 have no influence on the respective other master 12, 11. For example, if clock signal SCLK is being delivered by one of the two, or by both, masters 11, 12, three-state gate $16_{11}$ associated with the one master 11 can then be switched in such a way that it acts as a closed switch, while three-state gate $16_{12}$ associated with the other master 12 is switched in such a way that it acts as an open switch. A connection therefore no longer exists between the outputs of the two masters 11, 12 on which clock signal SCLK is being respectively delivered. The SCLK line that inherently connects between the two masters 11, 12 is thereby interrupted by one of the two three-state gates 16.

Both slaves 13, 14 are suitable for generating a slave data signal SO (=slave out), and delivering it via an SO line. The two SO lines coming from slaves 13, 14 are connected to one another, and attached to both masters 11, 12. The two masters 11, 12 are suitable for receiving and processing signal SO. No three-state gates may be contained in the SO lines.

The electrical circuit of FIG. 1 has a circuit portion 18 that is provided, among other purposes, in order to generate the Enable signal for three-state gates 16. An example of a configuration of circuit portion 18 may be gathered from FIG. 2.

A CS signal is conveyed to circuit portion 18 as an input signal. This CS signal is generated by an AND gate 19 that is impinged upon on the input side by the two select signals CS1, CS2. Signal CS is "high" or "1" only when neither of the two select signals CS1, CS2 is active. Otherwise signal CS is "low" or "0". Be it noted that in the present exemplifying embodiment it is assumed that select signals CS1, CS2 are "high" or "1" in their inactive state.

Figure 2:
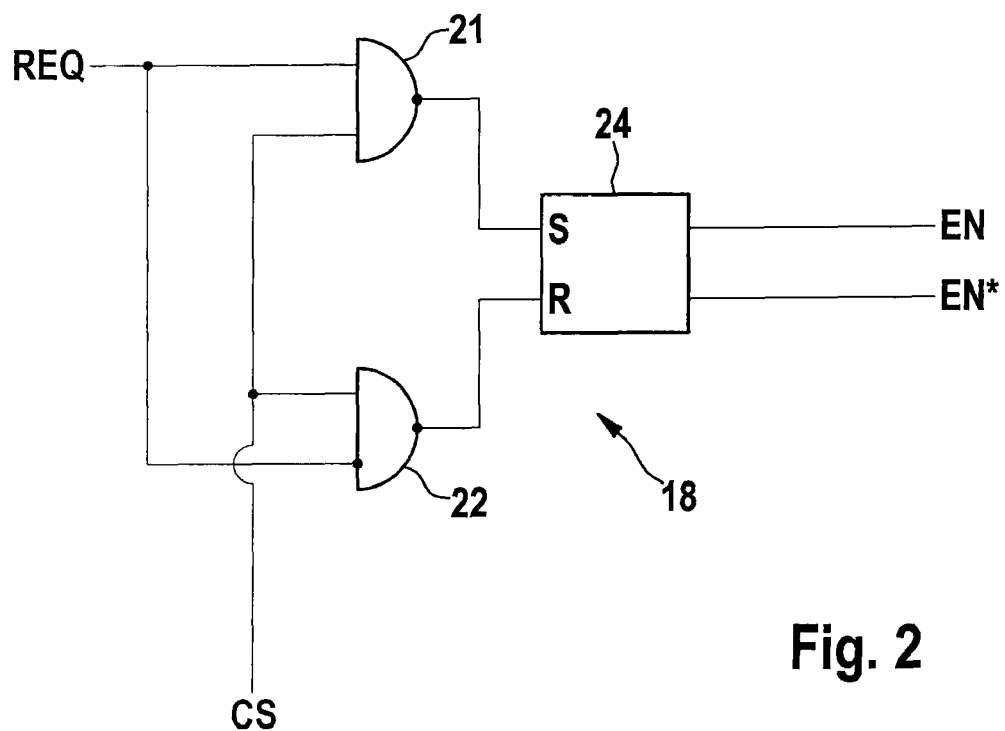
FIG. 2 is a more detailed block diagram of an exemplifying embodiment of a circuit portion of the circuit of FIG. 1.

According to FIG. 2, circuit portion 18 has two NAND gates 21, 22, to each of which signal CS is conveyed as an input signal. Also conveyed to the two NAND gates 21, 22 as an input signal is a request signal REQ that is generated by one of the two masters 11, 12 (in the present case by master 11). In the context of one of the two NAND gates 21, in the present case NAND gate 22, request signal REQ is inverted on the input side.

Request signal REQ is, as mentioned, generated by master 11 and made available there on the output side. When request signal REQ is set by master 11 to "high" or "1", master 11 is then requesting access to bus system 15. The other master 12 cannot generate a request signal REQ of this kind. Instead, master 12 obtains access to bus system 15 only when master 11 is not requesting access to bus system 15. Master 11 is in this regard at a higher level than master 12.

NAND gate 21 generates on the output side a Set signal that is "low" or "0" only when signal CS and request signal REQ are "high" or "1". Otherwise the Set signal is always "high" or "1". NAND gate 22 generates on the output side a Reset signal that is "low" or "0" only when signal CS is "high" or "1" and request signal REQ is "low" or "0". Otherwise the Reset signal is always "high" or "1".

The Set signal and Reset signal are conveyed to an S input and an R input of a flip-flop 24. Flip-flop 24 generates the Enable signal on the output side, specifically in the form of a non-inverted Enable signal EN and an inverted Enable signal EN*. Upon a transition of the S input of flip-flop 24 to "low" or "0", the Enable signal EN is set to "high" or "1", and the inverted Enable signal EN* is set to "low" or "0". Upon a transition of the R input of flip-flop 24 to "low" or "0", the Enable signal EN is set to "low" or "0", and the inverted Enable signal EN* is set to "high" or "1".

The non-inverted Enable signal EN impinges upon master 11 and upon those three-state gates $16_{11}$ that are present at the outputs of master 11 and are thus associated with master 11. The inverted Enable signal EN* impinges upon master 12 and upon those three-state gates $16_{12}$ that are present at the outputs of master 12 and are thus associated with master 12.

When the non-inverted Enable signal EN is "high" or "1", master 11 then has access to bus system 15. This results from the fact that three-state gates $16_{11}$ associated with master 11 act as closed switches, while three-state gates $16_{12}$ associated with master 12 act as open switches. In addition, master 11 recognizes this state of three-state gates 16 by way of the non-inverted Enable signal EN that is conveyed to it and is at "high" or "1", while master 12 recognizes the state by way of the inverted Enable signal EN* that is conveyed to it and is at "low" or "0". Master 11 thus "knows" that it can access bus system 15, while master 12 "knows" that it does not have access to bus system 15.

The result when the non-inverted Enable signal EN is "low" or "0" is the reverse: master 11 has no access to bus system 15, and master 12 does have access.

Three-state gates $16_{11}$ associated with master 11 and three-state gates $16_{12}$ associated with the other master 12 are thus always switched contradirectionally, so that three-state gates 16 associated with one of the two masters 11, 12 always act as closed switches, and three-state gates 16 associated with the other of the two masters 12, 11 always act as open switches.

During operation of electrical circuit 10 of FIG. 1, master 11 requests access to bus system 15 by setting request signal REQ to "high" or "1". As soon as both select signals CS1, CS2 are inactive, i.e. as soon as bus system 15 is free and therefore previous transmissions via bus system 15 have been completed, the non-inverted Enable signal EN is set to "high" or "1". Three-state gates $16_{11}$ associated with master 11 thus act as closed switches, while three-state gates $16_{12}$ associated with master 12 represent open switches. In addition, master 11 "knows" on the basis of the received enable signal EN that it can access bus system 15. Master 11 now selects one of the two slaves 13, 14 as receiver, with the aid of select signals CS1, CS2. Master 11 then delivers clock signal SCLK and master data signal MO. The selected slave receives master data signal MO according to the timing cycle of clock signal SCLK. The selected slave can furthermore send back slave data signal SO to master 11. As soon as master 11 no longer requires access to bus system 15, it sets request signal REQ to "low" or "0". The other master 12 can then, in corresponding fashion, access bus system 15 until master 11 once again sets request signal REQ to "high" or "1".

It is understood that the operation of circuit 10 as explained above is also possible with only a single slave. In that case the select signal serves only to indicate the end of a transmission of signals via bus system 15.

In circuit 10 of FIG. 1, a transmission of signals between the two masters 11, 12 is not possible. This is suppressed, as has been explained, by three-state gates 16.

Figure 3A:
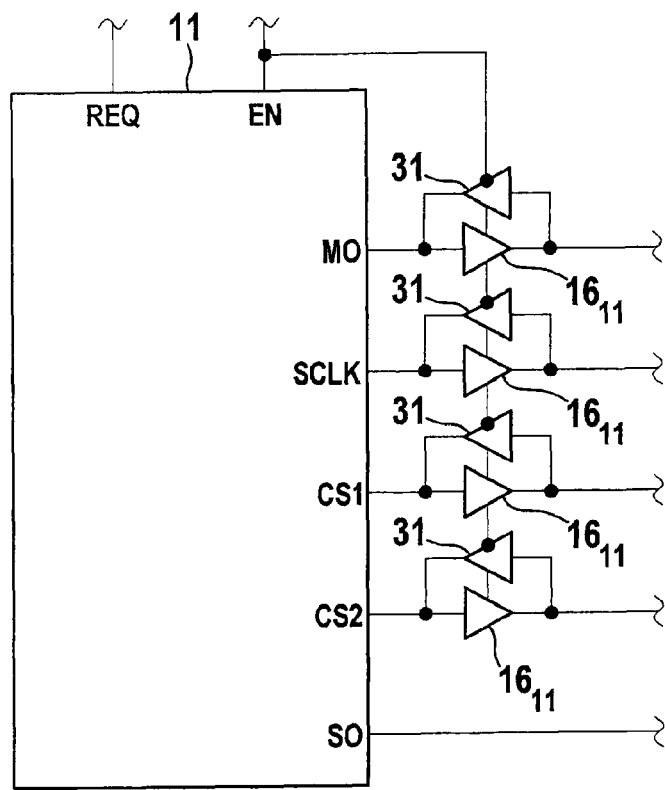
FIG. 3a shows a variant of another circuit portion of the circuit of FIG. 1.
Figure 3B:
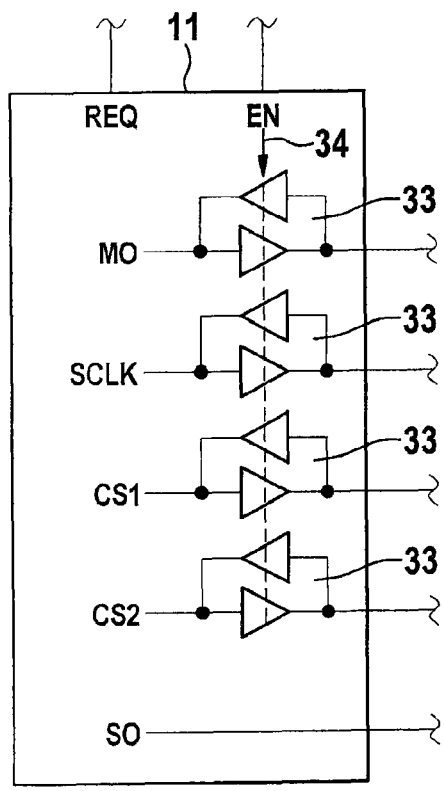
FIG. 3b shows a variant of another circuit portion of the circuit of FIG. 1.

If a transmission of signals between the two masters 11, 12 now needs to be possible, this can be achieved by modifying circuit portion 30, outlined as a dashed-line block in FIG. 1, in accordance with FIGS. 3a, 3b.

FIG. 3a depicts master 11 along with the signals that have been explained. In addition to three-state gates $16_{11}$, master 11 has associated with it further three-state gates 31 that are each connected in parallel with and contradirectionally to the individual three-state gates $16_{11}$. As before, three-state gates 16 are activated by the non-inverted Enable signal EN, while the additional three-state gates 31 are impinged upon by the inverted Enable signal EN*. The latter is evident from FIG. 3a, by the fact that the input of three-state gates 31 associated with the Enable signal EN is inverted.

When master 11 has access to bus system 15, additional three-state gates 31 thus act as open switches. In this case the manner of operation of the circuit of FIG. 3a corresponds to the explanations of FIG. 1. When master 12 has access to bus system 15, however, three-state gates 16 act as open switches and additional three-state gates 31 act as closed switches. The signals transmitted by master 12 on bus system 15 thus also travel to master 11. If master 11 is capable of receiving those signals, master 11 can now read and process, via additional three-state gates 31, the signals transmitted from the other master 12 on bus system 15.

In order for master 11 to be capable of receiving signals from bus system 15, it may be necessary to perform a corresponding changeover of master 11. This changeover can be controlled by the Enable signal EN conveyed to master 11.

In FIG. 3b is it assumed that two three-state gates 33, each connected antiparallel, are present at master 11 at its outputs. In this case these three-state gates 33 within master 11 can be controlled by software, as a function of the Enable signal EN that is delivered, in a manner corresponding to what has been explained for three-state gates 16, 31 of FIG. 3a. The latter is indicated in FIG. 3b with the aid of an arrow 34. The result thereby achievable is that master 11 can read and process the signals transmitted from master 12 on bus system 15.

It is understood that master 12 can also be equipped with corresponding additional three-state gates, so that master 12 can also read and process the signals transmitted from master 11 on bus system 15.

What is claimed is:

1. An electrical circuit for transmitting signals between two masters and one or more slaves, comprising:
   a bus system, wherein the two masters and the slave or slaves are connected to one another via the bus system, at least one master data signal being generatable by each of the two masters, wherein the at least one data signal is receivable by the slave or slaves;
   a different respective three-state gate at each output of the two masters at which a respective one of the master data signals of only one of the masters is present, wherein the respective three-state gates are effective either as closed switches or open switches;
   wherein the respective three-state gates are activatable so that when the respective three-state gate associated with the one of the two masters acts as a closed switch, the respective three-state gate associated with the other of the two masters acts as an open switch.

2. The electrical circuit of claim 1, wherein a clock signal is generatable by each of the two masters, the clock signal being receivable by the slave or slaves, and wherein there is a three-state gate at each of the outputs of the two masters at which the respective clock signal is present.

3. The electrical circuit of claim 1, wherein at least one select signal is generatable by each of the two masters, the at least one select signal being receivable by the slave or slaves, and wherein there is a three-state gate at each of the outputs of the two masters at which the respective select signal is present.

4. The electrical circuit of claim 1, wherein the three-state gate is activated as a function of a request signal that is generatable by one of the two masters when that master wishes to transmit signals on the bus system.

5. The electrical circuit of claim 1, wherein a counterdirectionally switched three-state gate is connected in parallel with each of the three-state gates, and wherein the counterdirectionally parallel connected three-state gates are activated in inverted fashion with respect to the three-state gates.

6. The electrical circuit of claim 3, wherein the three state gates are activated as a function of the select signal.

7. The electrical circuit of claim 6, wherein the three state gates are activated as a function of whether a transmission is taking place on the bus system.

8. An electrical circuit for transmitting signals between two masters and one or more slaves and for use in conjunction with an electronic control device of a motor vehicle, comprising:
   a bus system, wherein the two masters and the slave or slaves are connected to one another via the bus system, at least one master data signal being generatable by each of the two masters, wherein the at least one data signal is receivable by the slave or slaves;

a different respective three-state gate at each output of the two masters at which a respective one of the master data signals of only one of the masters is present, wherein the respective three-state gates are effective either as closed switches or open switches;

wherein the respective three-state gates are activatable so that when the respective three-state gate associated with the one of the two masters acts as a closed switch, the respective three-state gate associated with the other of the two masters acts as an open switch.

\* \* \* \* \*